(12) United States Patent
Yu et al.

(10) Patent No.: US 8,251,465 B2
(45) Date of Patent: Aug. 28, 2012

(54) SLIDE RAIL STRUCTURE

(75) Inventors: Mo-Ming Yu, Shenzhen (CN); Ze-Hong Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/080,602

(22) Filed: Apr. 5, 2011

(65) Prior Publication Data
US 2012/0141053 A1  Jun. 7, 2012

(30) Foreign Application Priority Data
Dec. 3, 2010  (CN) .......................... 2010 1 0572964

(51) Int. Cl.
*A47B 88/00* (2006.01)
(52) U.S. Cl. ................... 312/334.7; 312/334.8
(58) Field of Classification Search ............... 312/334.1, 312/334.4–334.6, 334.8, 334.14, 350; 384/22, 384/18, 20
See application file for complete search history.

(56) References Cited

U.S. PATENT DOCUMENTS

| | | | | |
|---|---|---|---|---|
| 3,588,198 A * | 6/1971 | Stewart | ........................ | 384/18 |
| 4,194,793 A * | 3/1980 | Offermans | ..................... | 384/18 |
| 4,469,384 A * | 9/1984 | Fler et al. | ..................... | 312/333 |
| 4,955,160 A * | 9/1990 | Rock | ......................... | 312/334.8 |
| 5,775,786 A * | 7/1998 | Liebertz | ................... | 312/334.8 |
| 6,244,678 B1 * | 6/2001 | Dopp et al. | ................. | 312/333 |
| 6,280,086 B1 * | 8/2001 | Stijns | ........................... | 384/18 |
| 6,854,816 B2 * | 2/2005 | Milligan | ................. | 312/334.11 |
| 6,984,008 B2 * | 1/2006 | Milligan | ....................... | 312/333 |
| 2004/0155563 A1 * | 8/2004 | Young et al. | .............. | 312/334.8 |
| 2004/0227441 A1 * | 11/2004 | Wang et al. | ............... | 312/334.8 |
| 2005/0218761 A1 * | 10/2005 | Chi | ........................... | 312/334.8 |
| 2008/0143226 A1 * | 6/2008 | Huang et al. | .............. | 312/334.8 |

* cited by examiner

*Primary Examiner* — Darnell Jayne
*Assistant Examiner* — Andres F Gallego
(74) *Attorney, Agent, or Firm* — Altis Law Group, Inc.

(57) ABSTRACT

A slide rail structure includes a first rail, a second rail, a third rail, and two bearing seats including bearings. The bearing seat is disposed between the first rail and the second rail. The second rail is received between the first rail and the third rail. The second rail slides relative to the first rail via the bearings. The third rail slidably contacts the second rail.

5 Claims, 3 Drawing Sheets

SLIDE RAIL STRUCTURE

BACKGROUND

1. Technical Field

The present disclosure relates to a slide rail structure.

2. Description of Related Art

Slide rail structures are widely used in many devices, such as drawers. Many slide rail structures include a first rail, a second rail, and a third rail. Slide mechanisms disposed between the first rail, the second rail, and the third rail include a ball-type structure and a friction-type structure. The ball-type structure can be smoothly slid, but is more costly. The friction-type structure has lower cost and better bearing capacity, but does not slide smoothly.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding portions throughout the figures.

DETAILED DESCRIPTION

Figure 1:
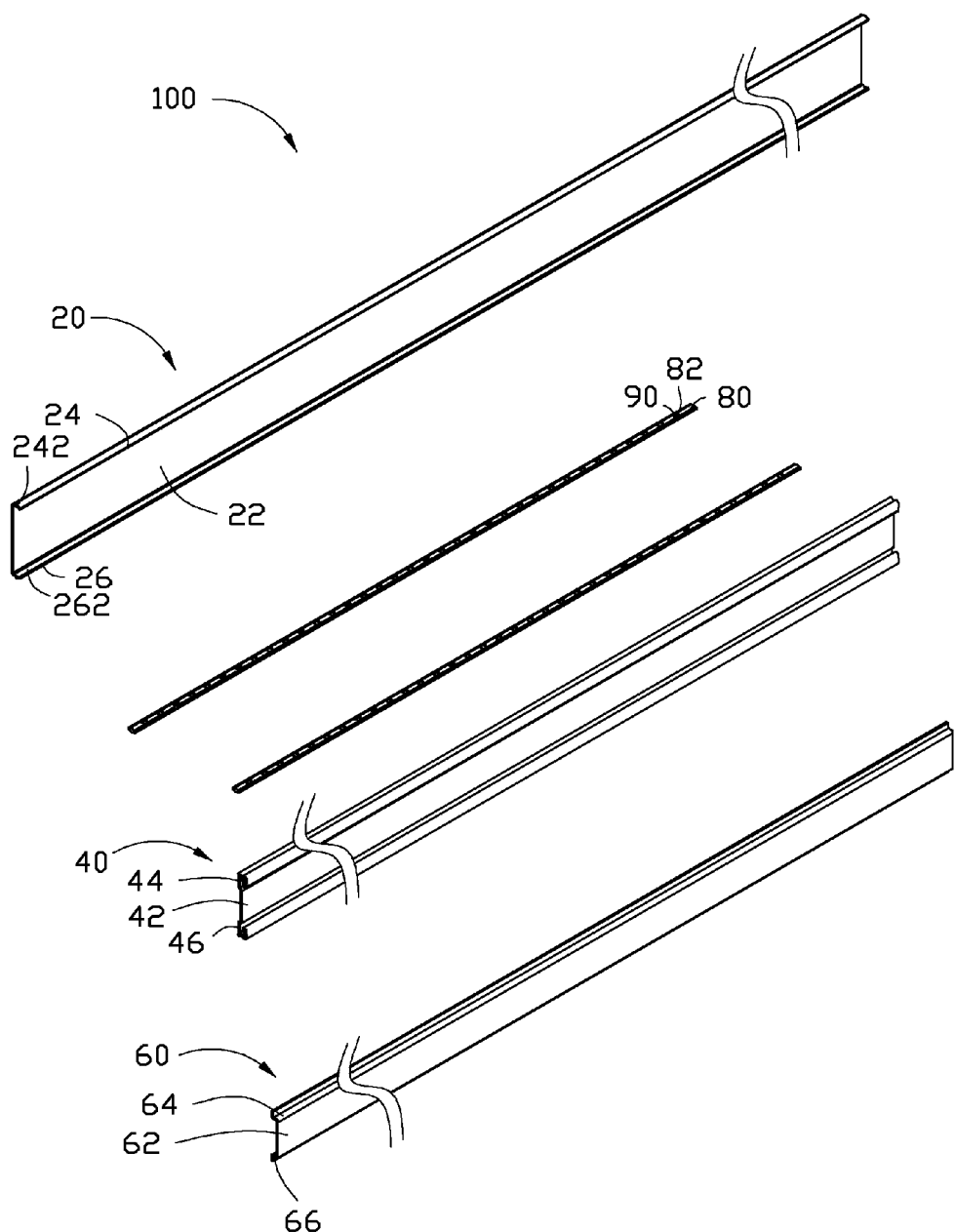
FIG. 1 is an exploded perspective view of an exemplary embodiment of a slide rail structure.

FIG. 1 is an exploded perspective view of an exemplary embodiment of a slide rail structure 100. The slide rail structure 100 includes a first rail 20, a second rail 40, a third rail 60, and two bearing seats 80 including bearings 90. The first rail 20 is attached to a fixture, such as a server cabinet or a cupboard. The third rail 60 is fixed on the walls of the server cabinet or a drawer of the cupboard.

Figure 2:
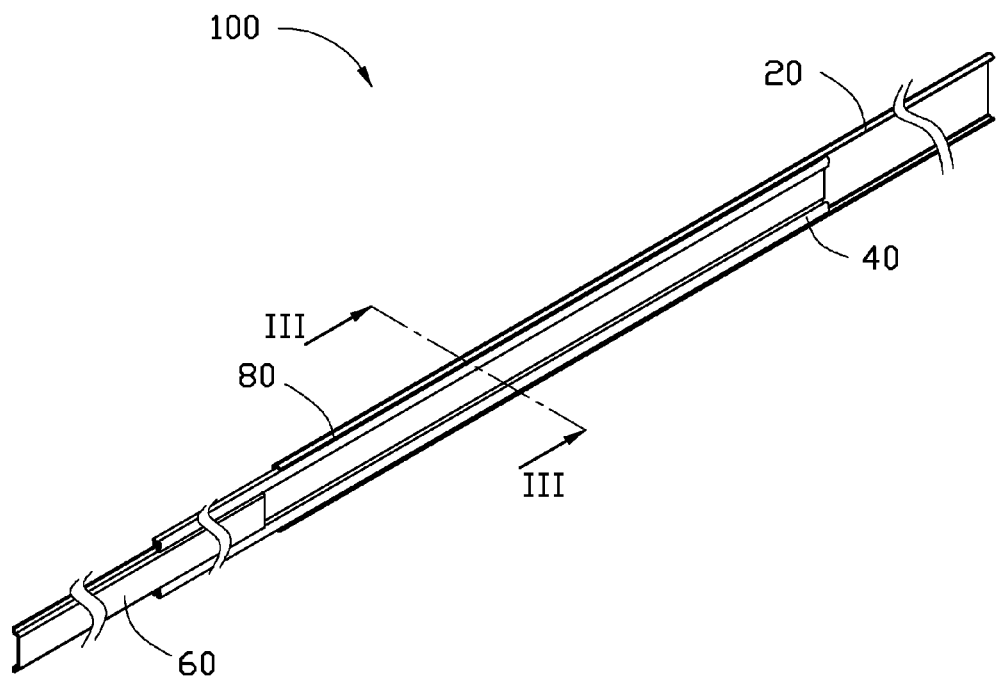
FIG. 2 is an assembled view of FIG. 1.

FIG. 2 is an assembled view of FIG. 1. The second rail 40 is received between the first rail 20 and the third rail 60. The two bearing seats 80 are disposed between the first rail 20 and the second rail 40. The second rail 40 can slide relative to the first rail 20 via the bearings 90. The third rail 60 slidably contacts the second rail 40 to slide relative to the second rail 40. As a result, the server and the drawer can be moved into and out of the server cabinet and the cupboard.

Figure 3:
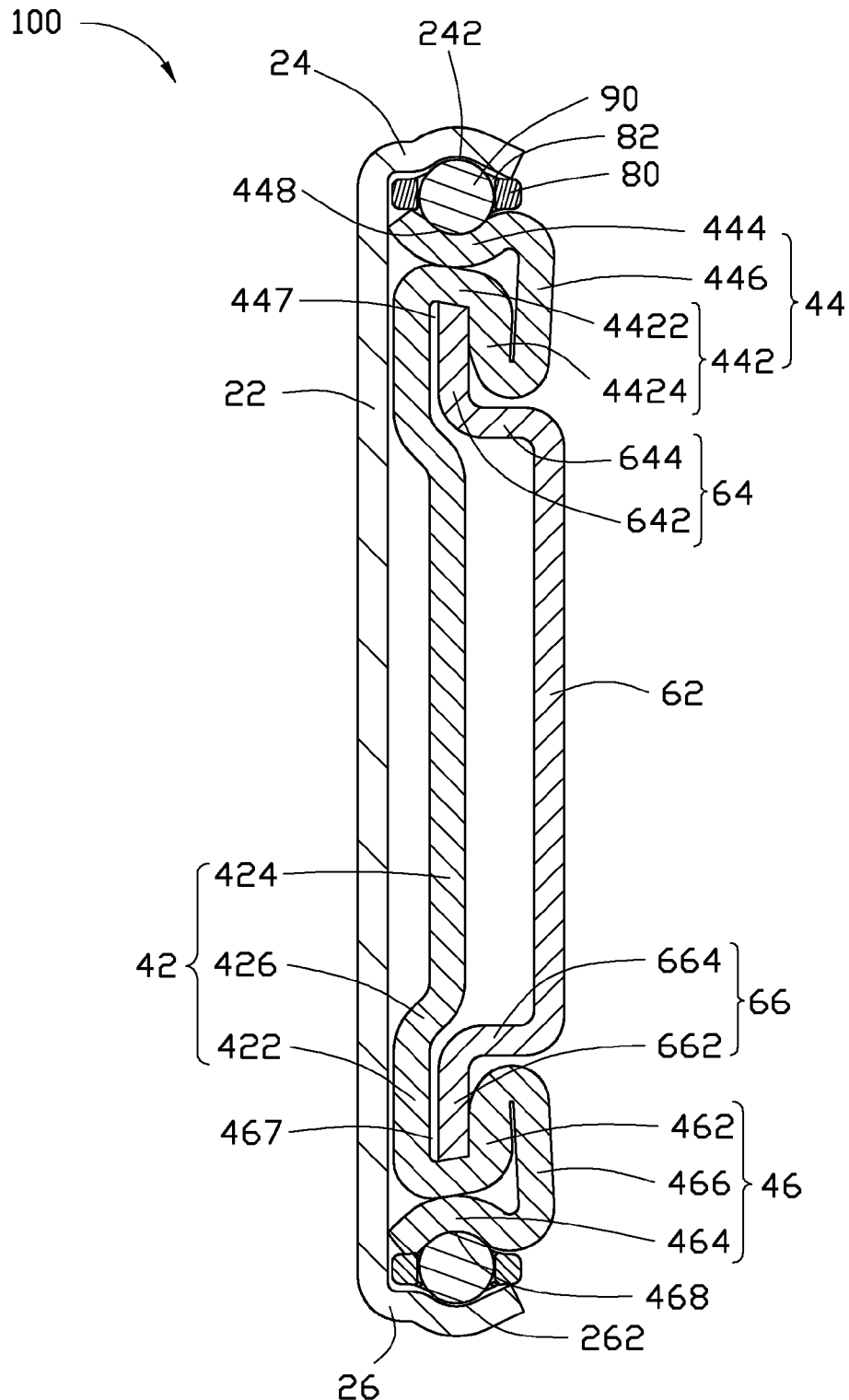
FIG. 3 is a sectional view of FIG. 2 taken along line III-III.

FIG. 3 is a sectional view of FIG. 2 taken along line III-III. The first rail 20 includes a fixed plate 22, an upper arm 24, and a lower arm 26. The upper arm 24 and the lower arm 26 extend from the fixed plate 22 and are bent toward the same direction. The inner side of the upper arm 24 defines an upper chute 242, which can receive portions of the bearings 90 exposed from the bearing seats 80. The inner side of the lower arm 26 defines a lower chute 262, which can receive portions of the bearings 90 exposed from the bearing seats 80. The upper chute 242 and the lower chute 262 are cambered.

The second rail 40 includes a bottom plate 42, an upper arm 44, and a lower arm 46.

The bottom plate 42 includes two straight ends 422, a protruding portion 424, and two inclines 426 connecting between the two straight ends 422 and the protruding portion 424. The protruding portion 424 is parallel to the two straight ends 422. The upper arm 44 and the lower arm 46 extend from the bottom plate 42 and are bent toward the protruding portion 424. The first rail 20 and the second rail 40 are slidably connected via the upper arms 24, 44 and the lower arms 26, 46.

The upper arm 44 includes a first bent portion 442, a second bent portion 444, and a connection plate 446 connected between the first bent portion 442 and the second bent portion 444. The first bent portion 442 includes a transverse plate 4422 and a longitudinal plate 4424. The transverse plate 4422 extends from one of the ends 422. The longitudinal plate 4424 extends from the transverse plate 4422. The one end 422, the transverse plate 4422, and the longitudinal plate 4424 jointly define a chute 447. The connection plate 446 extends from the longitudinal plate 4424 and is bent upward. The second bent portion 444 extends from the connection plate 446 and is bent near the first bent portion 442. One end of the second bent portion 444 away from the first bent portion 442 defines a chute 448, which can receive portions of the bearings 90 exposed from the bearing seats 80. The chute 448 is corresponding to the upper chute 242 of the first rail 20. The bottom surface of the second bent portion 444 abuts the top surface of the transverse plate 4422.

The lower arm 46 and the upper arm 44 are symmetrical. The lower arm 46 includes a first bent portion 462, a second bent portion 464, and a connection plate 466 connected between the first bent portion 462 and the second bent portion 464. The other end 422 and the first bent portion 462 jointly define a chute 467. One end of the second bent portion 464 away from the first bent portion 462 defines a chute 468, which can receive portions of the bearings 90 exposed from the bearing seats 80. The chute 468 is corresponding to the lower chute 262 of the first rail 20.

The third rail 60 includes a bottom plate 62, an upper arm 64, and a lower arm 66. The second rail 40 and the third rail 60 are slidably connected via the upper arms 44, 64 and the lower arms 46, 66. The bottom plate 62 is straight. The upper arm 64 and the lower arm 66 extend from the bottom plate 42 and are oppositely bent. The upper arm 64 includes a slide portion 642 and a connection portion 644. The slide portion 642 is slidably received in the chute 447 of the upper arm 44 of the second rail 40. The connection portion 644 is connected between the bottom plate 62 and the slide portion 642. The lower arm 66 and the upper arm 64 are symmetrical about the longitudinal axis of the third rail 60. The lower arm 66 includes a slide portion 662 and a connection portion 664. The slide portion 662 is slidably received in the chute 467 of the lower arm 46 of the second rail 40. The connection portion 664 connects between the bottom plate 62 and the slide portion 662.

Each of the two bearing seats 80 longitudinally defines a plurality of equally space holes 82. The bearings 90 are received in the plurality of holes 82.

In assembly, the second rail 40 is inserted into the first rail 20. The second bent portion 444 and the second bent portion 464 are respectively slidably received in the corresponding upper arm 24 and lower arm 26 of the first rail 20. The two bearing seats 80 are respectively assembled between the upper chute 242 and the lower chute 262 of the first rail 20, and the chute 448 and the chute 468 of the second rail 40. The third rail 60 is inserted into the second rail 40. The slide portion 642 and the slide portion 662 are respectively slidably received in the chute 447 and the chute 467 of the second rail 40. The second rail 40 can be slid relative to the first rail 20 via the bearings 90. The third rail 60 can be slid relative to the second rail 40 via the slide portion 642 and slide portion 662.

In another exemplary embodiment, the two bearing seats 80 are disposed between the third rail 60 and the second rail 40. The second rail 40 can slide relative to the third rail 60 via the bearings 90. The first rail 20 slidably contacts the second rail 40 to slide relative to the second rail 40.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of portions within the principles of the present invention to the full extent indicated by the broad general meaning of the terms in which the appended claims are expressed.

What is claimed is:

1. A slide rail structure, comprising:
 a first rail;
 a second rail;
 a third rail; and
 a pair of bearing seats comprising bearings;
 wherein the bearing seats are disposed between the first rail and the second rail, and the second rail slides relative to the first rail;
 wherein the third rail slidably contacts the second rail;
 wherein the second rail comprises a bottom plate and two arms extending from opposite sides of the bottom plate, each of the arms of the second rail comprises a substantially L-shaped first bent portion having a transverse plate directly formed from the bottom plate and a longitudinal plate parallel to the bottom plate, the first bent portion and the bottom plate bounding a first chute to slidably receive the third rail, each of the arms further comprises a connection plate directly formed from a distal end of the longitudinal plate and overlapping the longitudinal plate, and a curved second bent portion directly extending from a distal end of the connection plate and abuttingly supported on an outer side of the transverse plate, and two second chutes are respectively defined in an outer surface of the second bent portions to slidably receive the bearings.

2. The slide rail structure of claim 1, wherein the second rail is received between the first rail and the third rail.

3. The slide rail structure of claim 2, wherein the first rail comprises two arms, two third chutes are defined in inner sides of the corresponding arms of the first rail to align with the corresponding second chutes of the second rail and receive the bearings.

4. The slide rail structure of claim 3, wherein the first chutes of the second rail are defined in inner sides of the corresponding arms of the second rail, the third rail comprises opposite arms slidably received in the corresponding first chutes.

5. The slide rail structure of claim 3, wherein the bearing seats are respectively disposed between the third chutes of the first rail and the corresponding second chutes of the second rail.

* * * * *